(12) United States Patent
Kanazawa et al.

(10) Patent No.: US 9,899,241 B2
(45) Date of Patent: Feb. 20, 2018

(54) PLASMA PROCESSING METHOD

(71) Applicant: HITACHI HIGH-TECHNOLOGIES CORPORATION, Minato-ku, Tokyo (JP)

(72) Inventors: Shunsuke Kanazawa, Tokyo (JP); Yasuhiro Nishimori, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/434,562

(22) Filed: Feb. 16, 2017

(65) Prior Publication Data
US 2017/0243765 A1 Aug. 24, 2017

(30) Foreign Application Priority Data

Feb. 19, 2016 (JP) .................................. 2016-029463

(51) Int. Cl.
| | |
|---|---|
| *H01L 21/311* | (2006.01) |
| *H01L 21/67* | (2006.01) |
| *H01L 21/66* | (2006.01) |
| *H01J 37/32* | (2006.01) |

(52) U.S. Cl.
CPC .. *H01L 21/67069* (2013.01); *H01J 37/32137* (2013.01); *H01J 37/32449* (2013.01); *H01L 21/67253* (2013.01); *H01L 22/26* (2013.01); *H01J 2237/334* (2013.01)

(58) Field of Classification Search
None
See application file for complete search history.

(56) References Cited

U.S. PATENT DOCUMENTS

| | | |
|---|---|---|
| 2013/0048082 A1 | 2/2013 | Abatchev et al. |
| 2017/0031352 A1* | 2/2017 | Abatchev ............. G05B 19/418 |

FOREIGN PATENT DOCUMENTS

| | | |
|---|---|---|
| JP | 2013-058749 A | 3/2013 |
| KR | 10-2009-0028991 A | 3/2009 |
| KR | 10-2013-0017632 A | 2/2013 |

OTHER PUBLICATIONS

Office Action dated Oct. 25, 2017 for related Korean Application No. 10-2016-0175277.

* cited by examiner

*Primary Examiner* — Jack Chen
(74) *Attorney, Agent, or Firm* — Miles & Stockbridge P.C.

(57) ABSTRACT

A plasma processing method which performs plasma processing on a sample by a plurality of steps includes a first step of stopping supply of gas of one step while supplying an inert gas and a second step stopping the supply of the inert gas of the first step while as supplying a gas of the other step after the first step. An amount of the gas of the one step remaining inside a process chamber in which the sample is plasma-processed is detected in the first step. An amount of the gas of the other step reached inside the process chamber is detected in the second step. The one step is switched to the other step based on the amount of the gas of the one step detected in the first step and the amount of the gas of the other step detected in the second step.

6 Claims, 4 Drawing Sheets

PLASMA PROCESSING METHOD

BACKGROUND OF THE INVENTION

1. Field of the Invention

The present invention relates to a plasma processing method and, particularly to a plasma processing method which can perform microfabricated or microfabrication plasma processing while replacing gas during the plasma processing.

2. Description of the Related Art

Due to the miniaturization of semiconductor technology and the complication of structure in recent years, vertical profile with a high aspect ratio has been required for an etching process in semiconductor microfabrication. To achieve this, various methods have been known. One of them employs cycle etching to progress etching by alternately repeating two or more processes. For example, there is a method for progressing etching by alternately repeating etching and protection film forming.

Each process constituting the cycle etching has set values of gas type, gas flow rate, pressure in a process chamber, radio-frequency power supplied to an electrode substrate, and the like. To enhance the effects of the gas in each process, the supply timing of the gas, used in each process, and the radio-frequency power, supplied to the electrode substrate for generating bias, should be synchronized.

An amount of the gas introduced into the process chamber is controlled generally by giving a control signal to a mass flow controller (hereinafter, referred to as an MFC) to flow a desired flow rate. However, a delay of approximately one second occurs to introduce the gas into the process chamber after the signal of the flow rate is given to the MFC due to a response time of MFC, pressure, gas flow and the like in a gas piping, shower plates and the process chamber. Moreover, this delay varies about 0.2 to 0.3 seconds.

Thus, if a time for applying the radio-frequency power to the electrode is not controlled in consideration of the delay that the gas is actually introduced to the process chamber after the control signal is given to the MFC, a non-negligible time lag occurs between the timing of generating plasma for performing etching or protection film forming in the process chamber and the timing of generating a bias suitable for each process. This makes it impossible to achieve the optimum processes.

As a method for synchronizing supply timing of the gas and the radio-frequency power applied to the electrode substrate for generating bias, a method for synchronizing the radio-frequency power by determining a replacing time of an etching gas and a protection film forming gas by using an emission spectrum/mass spectrometer to detect the gas concentration is disclosed in JP-2013-58749-A.

SUMMARY OF THE INVENTION

However, the following points have not been considered enough in the above conventional technology.

In the technology described in JP-2013-58749-A, a first process gas is introduced to a process chamber, and the emission spectrum and concentration of the gas are detected. Thereafter, the corresponding first radio-frequency bias power is applied. In this case, the process chamber is not filled with the first process gas when the first radio-frequency bias power is applied. Thus, the optimum first processing cannot be performed.

Moreover, in JP-2013-58749-A, to start a rapid alternating process, a second process gas is introduced, and the emission spectrum and concentration of the gas are detected. Thereafter, the corresponding second bias power is applied. In this case, the first process gas still remains in the process chamber when the second process gas is detected. Thus, unexpected etching occurs due to the reaction between the first and second process gases. Furthermore, the delay time between the time when a signal of a flow rate is given to the MFC and the time when the gas is introduced to the process chamber varies 0.2 to 0.3 seconds. Thus, the delay time varies each time the step is switched, making it impossible to achieve detection of highly stable step switching.

In light of the above problems, the present invention provides a plasma processing method which enables highly stable detection of the step switching in the plasma processing method which performs plasma processing while replacing gas during the plasma processing.

The feature of the present invention is that a plasma processing method which performs plasma processing on a sample in a process chamber by a plurality of steps constituting plasma processing conditions includes: a first step of performing one step; a second step of stopping supply of a gas in the one step while supplying an inert gas after the first step; a third step of stopping the supply of the inert gas in the second step while supplying a gas in another step after the second step; and a fourth step performing the other step, in which an amount of the gas in the one step remaining inside the process chamber is detected in the second step, an amount of the gas in the other step reached inside the process chamber is detected in the third step, the second step is transitioned to the third step based on a detection result in the second step, and the third step is transitioned to the fourth step based on a detection result in the third step.

The present invention enables detection of highly stable step switching in a plasma processing method which performs plasma processing while replacing gas during the plasma processing.

DESCRIPTION OF THE PREFERRED EMBODIMENTS

Figure 1:
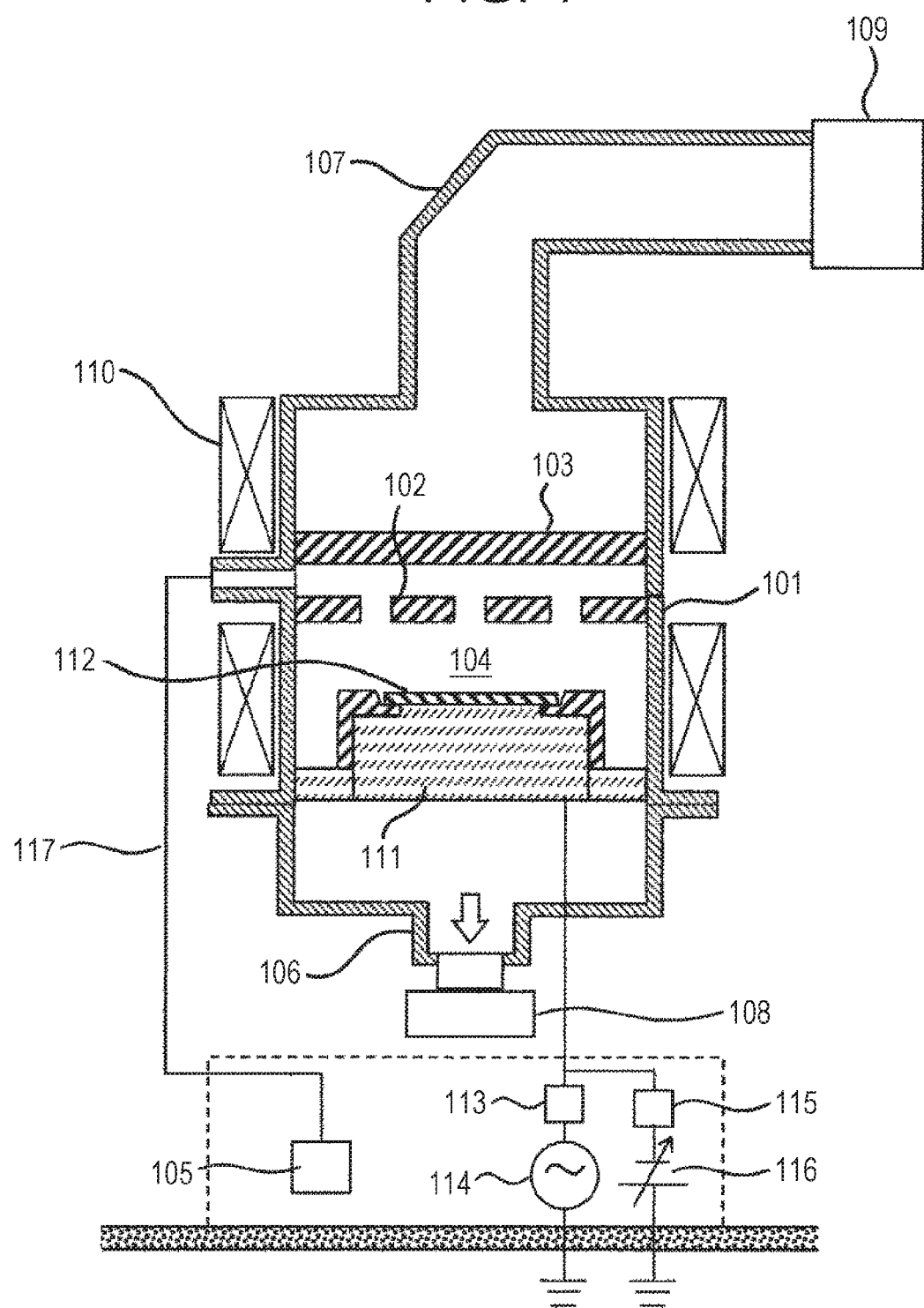
FIG. 1 is a longitudinal sectional view for illustrating the configuration of a plasma processing device according to an example of the present invention.

Hereinafter, the embodiments of the present invention will be described using drawings. First, a microwave electron cyclotron resonance (ECR) etching device used in an example will be described using FIG. 1.

An upper part of a vacuum vessel 101 is open. A quartz dielectric window 103 is provided at the upper part of the vacuum vessel 101 to seal an etching gas in the vacuum vessel 101, thereby forming a process chamber 104. Quartz shower plates 102 are provided at the upper part of the vacuum vessel 101 to introduce the etching gas into the vacuum vessel 101. The shower plates 102 are connected to a mass flow controller (MFC) 105 for flowing the etching gas via a gas piping 117. Moreover, the vacuum vessel 101 is connected to an evacuation device 108 via an evacuation port 106.

A first radio-frequency power supply 109 is provided as a plasma generating device. To transmit radio-frequency power to the process chamber 104 to generate plasma, a waveguide 107 is provided above the dielectric window 103. Magnetic field generating coils 110 are provided around the periphery of the process chamber 104. The radio-frequency power oscillated from the first radio-frequency power supply 109 interacts with magnetic fields formed by the magnetic field generating coils 110 to generate high density plasma in the process chamber 104.

Moreover, an electrode 111 is provided at a lower part of the vacuum vessel 101, facing the dielectric window 103. A wafer 112, i.e., a sample, is placed on the electrode 111. A surface of the electrode 111, i.e., a sample stage, is covered by a spray deposit (not shown) and connected to a direct current power supply 116 via a radio-frequency filter 115.

Furthermore, the electrode 111 is connected to a second radio-frequency power supply 114 via a matching circuit 113. The wafer 112 is placed on the electrode 111, and a bias potential is formed on the surface of the wafer by the radio-frequency power supplied from this radio-frequency bias power supply 114 (hereinafter, referred to as RF bias power). Ions are drawn to an upper surface of the wafer by a potential difference between the bias potential and the plasma generated in the process chamber 104 above the electrode 111. Note that a peak-to-peak voltage generated at the wafer 112 by the RF bias power supplied from the second radio-frequency power supply 114 is referred to as Vpp hereinafter. Moreover, "peak-to-peak voltage" is synonymous with "inter-peak voltage."

Next, an example of the present invention using the aforementioned microwave ECR etching device will be described hereinafter.

Figure 2:
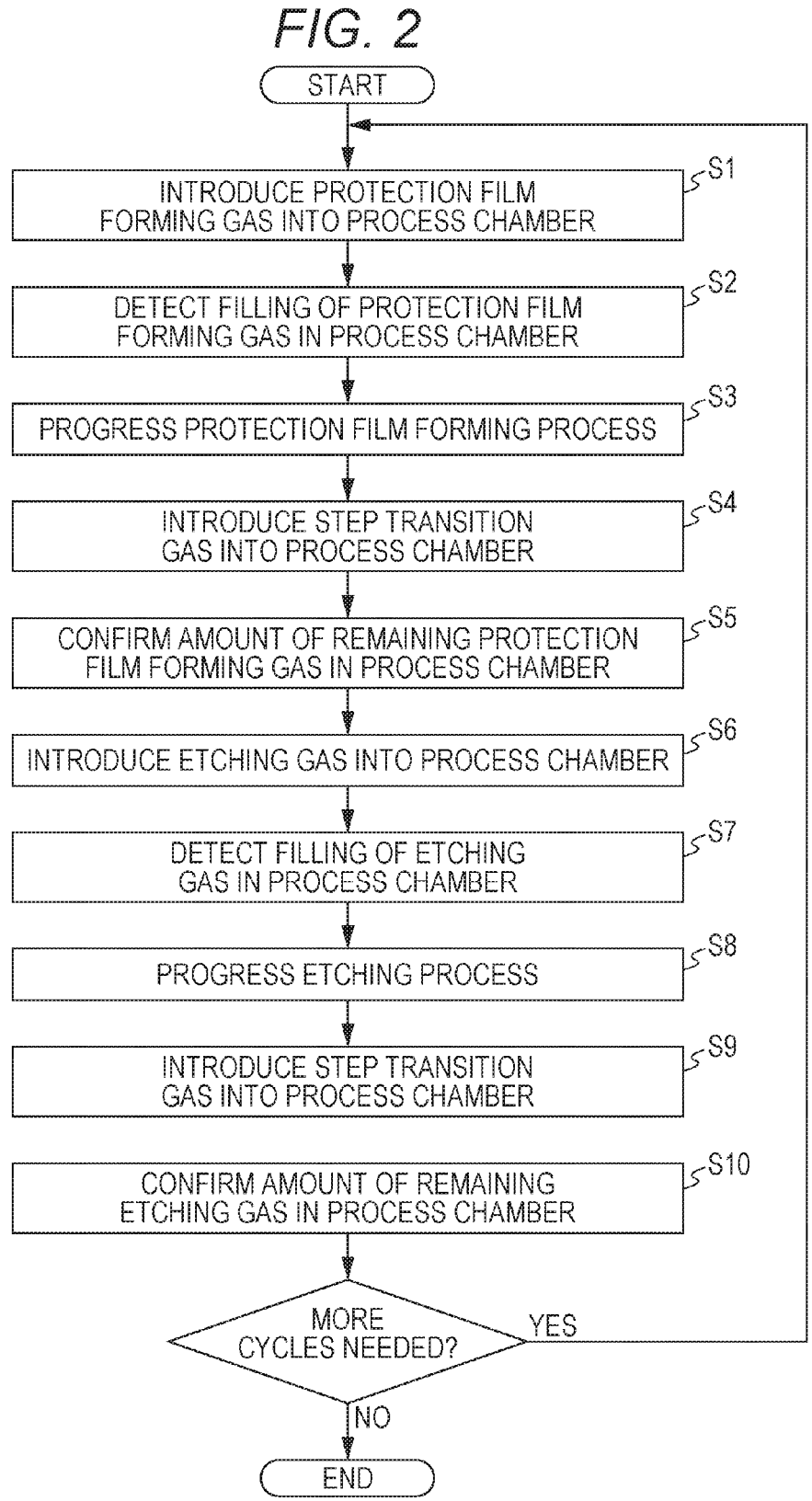
FIG. 2 is a flowchart showing cycle etching.

FIG. 2 is a flowchart of cycle etching according to the present invention. In FIG. 2, the first and second process steps constituting the cycle etching are protection film forming steps and etching steps, respectively. Transition steps are inserted between the process steps. In the transition steps, plasma discharge is continued by introducing a gas which does not etch the processed substrate in a vacuum process chamber and can continue plasma discharge. More specifically, the protection film forming steps are S1 to S3, the transition steps are S4 to S5 and S9 to S10, and the etching steps are S6 to S8. Moreover, both the protection film forming steps and the etching steps constitute plasma processing conditions. In other words, the plasma processing conditions are one step or an aggregate of a plurality of steps. The flowchart of FIG. 2 will be described hereinafter.

First, a control signal is given to an MFC to start supply of a protection film forming gas used in the protection film forming steps, and the protection film forming gas is inputted to a process chamber (S1). However, a delay of approximately one second actually occurs for the gas to reach the process chamber after the signal is given to the MFC due to a response time of MFC, pressure, gas flow and the like in the gas piping, the shower plates and the process chamber. After this delay, the protection film forming gas is supplied to the process chamber. After detecting that the gas has reached the process chamber (S2), a protection film forming process starts.

In the protection film forming process, the RF bias power and other parameters are applied (S3). After the protection film forming process has progressed, a step transition gas is introduced into the process chamber (S4). After a delay of approximately one second, the step transition gas reaches the process chamber. Then, the gas in the process chamber gradually switches from the protection film forming gas to the step transition gas, and emission spectrum and plasma density change. When the emission spectrum and the plasma density become constant values, it is determined that the process chamber is filled with the step transition gas or there is no protection film forming gas remaining in the process chamber (S5). Subsequently, the etching gas used in the etching steps is inputted (S6).

After a delay of approximately one second, the etching gas reaches the process chamber. Then, the gas in the process chamber gradually switches from the step transition gas to the etching gas, and the emission spectrum and the plasma density change. When the emission spectrum and the plasma density become constant values, it is determined that the process chamber is filled with the etching gas (S7), and the etching process starts. In the etching process, RF bias and other parameters are switched, and the etching process progresses (S8).

After the etching process has progressed, the step transition gas is introduced again into the process chamber (S9). After a delay of approximately one second, the step transition gas reaches the process chamber. Then, the gas gradually switches from the etching gas to the step transition gas, and the emission spectrum and the plasma density change. When the emission spectrum and the plasma density become constant values, it is determined that the process chamber is filled with the step transition gas or there is no protection film forming gas remaining in the process chamber (S10).

When more etching is needed, the process returns to S1, and a cycle of S1 to S10 is performed again until a target etching depth is reached. When the target etching depth is reached, the cycle ends. In the example, the cycle etching starts from the protection film forming process. However, the sequence will be the same even when the cycle starts from the etching steps or transition steps, and the same effects can be obtained.

Next, step switching based on detection of gas filling completion according to the present invention will be detailed. The feature of the present invention is that it is possible to precisely synchronize the process gas in the process chamber with the radio-frequency bias power by switching to the RF bias and other parameters of the subsequent step after detecting that there is completely no remaining gas introduced to the process chamber in the previous step and filling of the gas of the subsequent step in the process chamber is completed.

Figure 3:
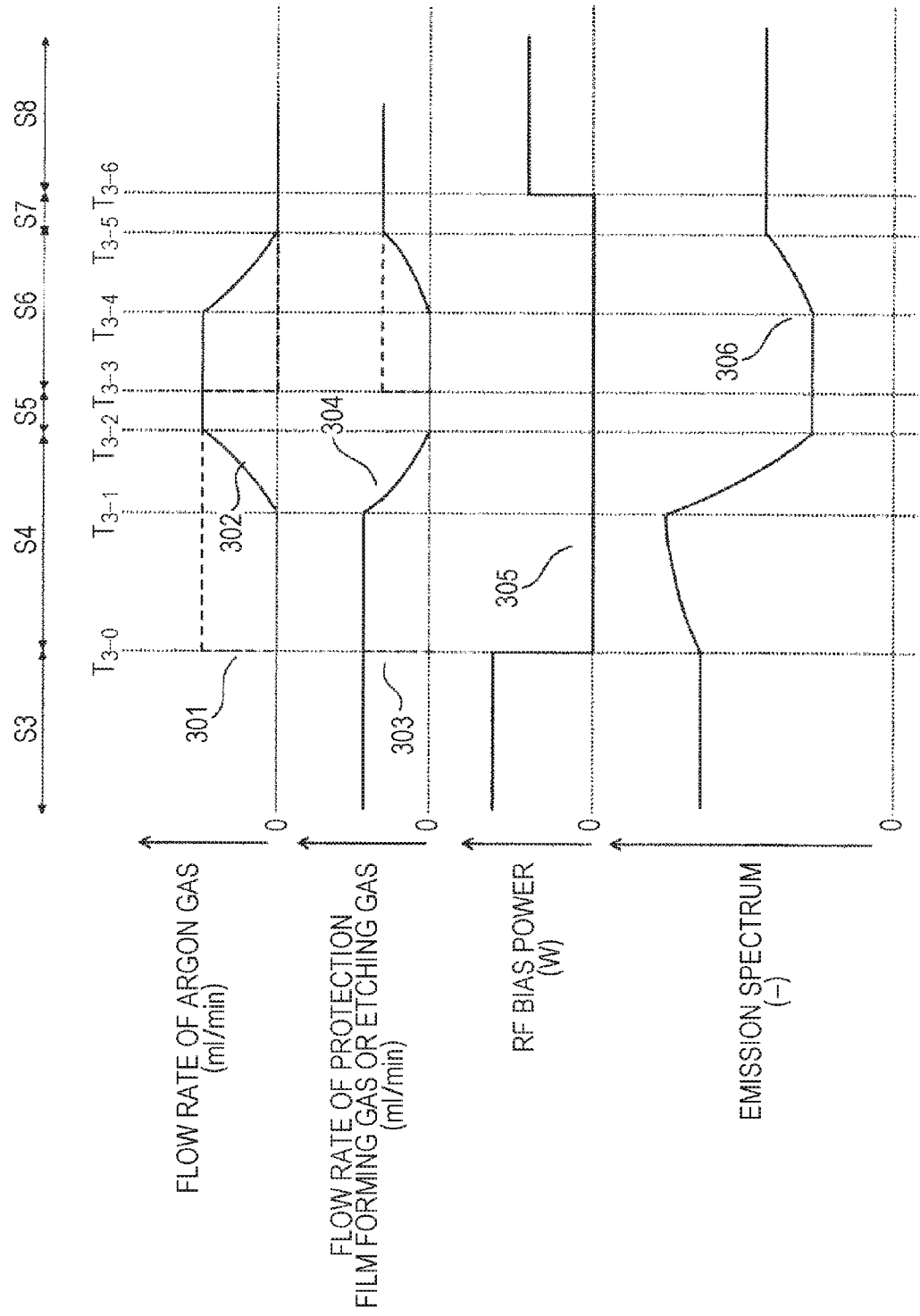
FIG. 3 is a sequence diagram of a case where gas replacement is detected by changes in plasma emission.
Figure 4:
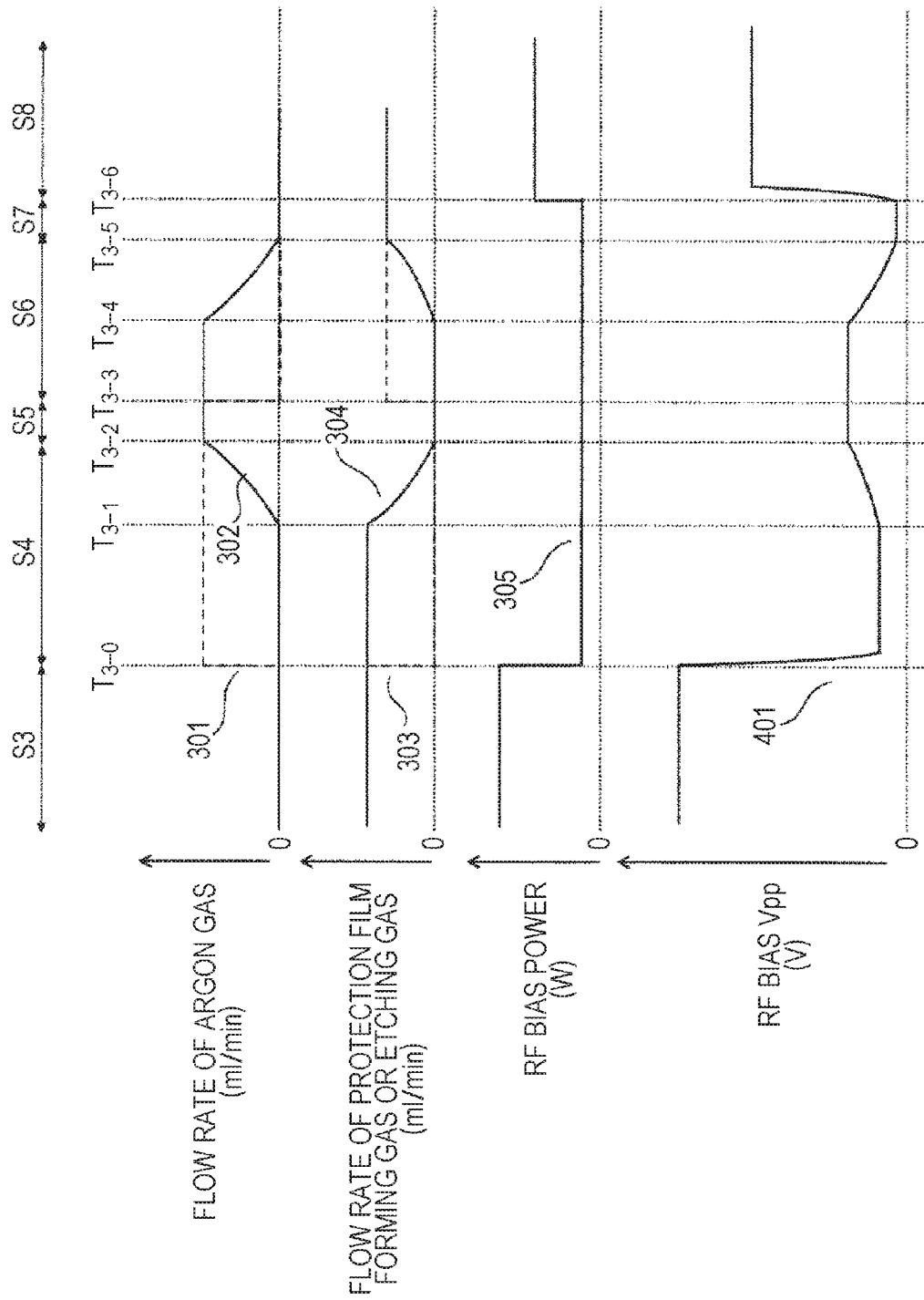
FIG. 4 is a sequence diagram of a case where the gas replacement is detected by changes in a peak-to-peak voltage of RF bias power.

As examples of a method for detecting the completion of the filling of the gas of the subsequent step in the process chamber, a method for detecting by emission spectrum by plasma is shown in FIG. 3, and a method for detecting from changes in Vpp is shown in FIG. 4. S3 to S8 in FIGS. 3 and 4 correspond to the protection film forming process progress (S3) to the etching process progress (S8) in FIG. 2. Moreover, Argon gas is used for the transition steps in FIGS. 3 and 4.

First, a method for detecting the filling of the gas by the emission spectrum by the plasma will be described using FIG. 3. A dotted line 301 indicates a set value of the argon gas in the MFC. A dotted line 303 indicates a set value of the protection film forming gas or the etching gas in the MFC. Solid lines 302 and 304 indicate a flow rate of the argon gas and a flow rate of the protection film forming gas or the etching gas, which flow in the process chamber, respectively. A solid line 305 indicates an RF bias power applied, and a solid line 306 indicates the emission spectrum by the plasma.

The protection film forming steps progress until they reach time $T_{3\text{-}0}$ (S3). After the protection film forming steps have progressed, a control signal is transmitted to the MFC at time $T_{3\text{-}0}$ to input the argon gas as indicated by the dotted line 301. Simultaneously, a control signal is transmitted to the MFC so that a supply of the protection film forming gas becomes 0 (ml/min) (dotted line 303). Moreover, the RF bias power is also switched to 0 (W). However, although the RF bias power switches immediately after the signal is given, a delay of approximately one second occurs for the gas to reach the process chamber after the signal is given to the MFC due to a response time of MFC, pressure, gas flow and the like in the gas piping, the shower plates and the process chamber.

Because of this delay, a constant amount of the protection film forming gas flows in the process chamber from time $T_{3\text{-}0}$ to time $T_{3\text{-}1}$ as indicated by the solid line 304. After the time $T_{3\text{-}1}$, a flow rate of the protection film forming gas remaining in the process chamber decreases and becomes 0 (ml/min) thereafter. By contrast, as indicated by the solid line 302 the argon gas starts to flow in the process chamber after the time $T_{3\text{-}1}$, which is after the delay of the time the signal is given to the MFC at time $T_{3\text{-}0}$, and a constant amount of the argon gas flows in the process chamber thereafter. The emission spectrum 306 changes from the time $T_{3\text{-}0}$ to the time $T_{3\text{-}1}$ and changes even more from the time $T_{3\text{-}1}$ to the time $T_{3\text{-}2}$.

It is considered that the change from the time $T_{3\text{-}0}$ to the time $T_{3\text{-}1}$ is due to reaction products by a change in the RF bias power and the change from the time $T_{3\text{-}1}$ to the time $T_{3\text{-}2}$ is due to a change in plasma density, caused by a decrease in the protection film forming gas 304 remaining in the process chamber and an increase in the argon gas 302. Thereafter, when the emission spectrum 306 becomes constant from the time $T_{3\text{-}2}$ to the time $T_{3\text{-}3}$, it is determined that the process chamber is filled with the argon gas. Next, a control signal is transmitted to the MFC at the time $T_{3\text{-}3}$ to supply the etching gas, as indicated by the dotted line 303. Simultaneously at the time $T_{3\text{-}3}$, a control signal is transmitted to the MFC so that a supply of the argon gas becomes 0 (ml/min) (dotted line 301).

Because of a delay of approximately one second, a constant amount of the argon gas flows in the process chamber after that the signal is given to the MFC at the time $T_{3\text{-}3}$ until the time $T_{3\text{-}4}$, as indicated by the solid line 302. After the time $T_{3\text{-}4}$, a flow rate of the argon gas remaining in the process chamber decreases and becomes 0 (ml/min) thereafter. By contrast, as indicated by the solid line 304, the etching gas starts to flow in the process chamber after the time $T_{3\text{-}4}$, which is after the delay of the time the signal is given to the MFC at time $T_{3\text{-}3}$, and a constant amount of the etching gas flows in the process chamber thereafter. The emission spectrum 306 exhibits a constant value until the time $T_{3\text{-}4}$ and then changes from the time $T_{3\text{-}4}$ to the time $T_{3\text{-}5}$.

This is because the plasma density has changed due to a decrease in the argon gas 302 remaining in the process chamber and an increase in the etching gas 304. When the emission spectrum changes and subsequently becomes constant from the time $T_{3\text{-}5}$ to the time $T_{3\text{-}6}$, it is determined that the process chamber is filled with the etching gas. The RF bias power and other parameters are switched to those in the etching process at the time $T_{3\text{-}6}$ to start the etching steps.

Next, a method for detecting the filling of gas by changes in VPP will be described using FIG. 4. A solid line 401 indicates the Vpp. First, in FIG. 4, control signals are transmitted to the MFCs of the argon gas 301 and the protection film forming gas 303 at the time $T_{3\text{-}0}$ to switch the RF bias power to a value greater than 0 (W). Since the RF bias power is applied even after the time $T_{3\text{-}0}$, a value greater than 0 (V) can be obtained for the Vpp. After the delay, from the time $T_{3\text{-}1}$ to the time $T_{3\text{-}2}$, the flow rate of the protection film forming gas remaining in the process chamber decreases and the flow rate of the argon gas increases, as indicated by the solid lines 304 and 302, respectively.

At this time, Vpp 401 changes due to a change in the plasma density. Thereafter, when the Vpp 401 becomes constant from the time $T_{3\text{-}2}$ to the time $T_{3\text{-}3}$, it is determined that the process chamber is filled with the argon gas. Next, a control signal is transmitted to the MFC at the time $T_{3\text{-}3}$ to input the etching gas as indicated by the dotted line 303. Simultaneously at the time $T_{3\text{-}3}$, a control signal is transmitted to the MFC so that a supply of the argon gas becomes 0 (ml/min) (dotted line 301). Because of a delay of approximately one second, a constant amount of the argon gas flows in the process chamber after that the signal is given to the MFC at the time $T_{3\text{-}3}$ until the time $T_{3\text{-}4}$, as indicated by the solid line 302.

After the time $T_{3\text{-}4}$, a flow rate of the argon gas remaining in the process chamber decreases and becomes 0 (ml/min) thereafter. By contrast, as indicated by the solid line 304, the etching gas starts to flow in the process chamber after the time $T_{3\text{-}4}$, which is after the delay of the time the signal is given to the MFC at time $T_{3\text{-}3}$, and a constant amount of the etching gas flows in the process chamber thereafter. The Vpp 401 exhibits a constant value from the time $T_{3\text{-}2}$ until the time $T_{3\text{-}4}$ and then changes from the time $T_{3\text{-}4}$ to the time $T_{3\text{-}5}$.

This is because the plasma density has changed due to a decrease in the argon gas 302 remaining in the process chamber as well as an increase in the etching gas 304. When the Vpp 401 changes and subsequently becomes constant from the time $T_{3\text{-}5}$ to the time $T_{3\text{-}6}$, it is determined that the process chamber is filled with the etching gas. The RF bias power and other parameters are switched to those in the etching process at the time $T_{3\text{-}6}$ to start the etching steps.

In the example, a method for detecting the filling of the gas in the process chamber from the emission spectrum and the behavior of Vpp has been described. However, the detection can be performed by other parameters affected by plasma, such as gas concentration and pressure. Moreover, FIGS. 3 and 4 show a sequence which sequentially performs the protection film forming process, the transition steps and the etching process. However, a sequence which sequentially performs the etching process, the transition steps and the protection film forming process can be similarly applied to the present invention. Furthermore, the emission spectrum 306 in FIG. 3 and the behavior of the Vpp 401 in FIG. 4 depend on a type, a flow rate and the like of process gas. Thus, the present invention is not limited to the behavior (delay time and the like) indicated by the solid line 402 in FIG. 4. Next, specific examples of the plasma processing conditions according to an embodiment of the present invention will be shown.

First, Table 1 shows conventional cycle etching conditions. The cycle etching conditions are constituted mainly by two steps, i.e., the protection film forming step and the etching step. In the step 1, as the protection film forming step, $O_2$ gas is used, and an RF bias power of 50 W is applied. In the step 2 as the etching step, $Cl_2$ gas is used, and an RF bias of 300 W is applied. After the step 3, the process returns to the step 1 and continues the cycle etching when more cycles are needed.

TABLE 1

| Step No. | 1 | 2 | After 3 |
|---|---|---|---|
| Step Time (sec) | 3 | 5 | Return to Step 1 when more cycles are needed. |
| Cl₂ Gas (ccm) | 0 | 100 | |
| HBr Gas (ccm) | 0 | 0 | |
| O₂ Gas (ccm) | 30 | 0 | |
| Ar gas (ccm) | 0 | 0 | |
| Pressure (Pa) | 0.3 | 0.5 | |
| Microwave Power (W) | 600 | 800 | |
| RF Bias Power (W) | 50 | 300 | |
| Name of Process | Protection Film Forming | Etching | |

Table 2 shows cycle etching conditions according to the present invention. Similar to those in Table 1, the cycle etching conditions are constituted mainly by the protection film forming step and the etching step. In the present invention, a transition step is inserted between each process step (protection film forming step or etching step) constituting the cycle etching. However, seconds are not set in the recipe since the time of transition step is determined by detecting the gas replacement by the plasma emission or the like. Thus, in Table 2, a column for the transition step is provided separately from the process steps constituting the cycle etching. This facilitates the setting of the recipe. Note that a predetermined gas replacement may be set as a time of transition step.

TABLE 2

| Step No. | 1 | 2 | After 3 | Transition Step |
|---|---|---|---|---|
| Step Time (sec) | 3 | 5 | Return to Step 1 when more cycles are needed. | — |
| Cl₂ Gas (ccm) | 0 | 100 | | 0 |
| HBr Gas (ccm) | 0 | 0 | | 0 |
| O₂ Gas (ccm) | 30 | 0 | | 0 |
| Ar gas (ccm) | 0 | 0 | | 100 |
| Pressure (Pa) | 0.3 | 0.5 | | 0.4 |
| Microwave Power (W) | 600 | 800 | | 700 |
| RF Bias Power (W) | 50 | 300 | | 0 |
| Name of Process | Protection Film Forming | Etching 1 | | Argon |

In the transition step, an Ar gas is used, and a 0 W RF bias power is used so that the processed substrate is not etched. When the transition step is provided, the present invention can be performed by setting the transition step to be always inserted between each process step. Moreover, when the gas replacement in the process chamber is detected by the changes in Vpp as shown in FIG. 4, the detection can be performed by applying a low RF bias power in the transition step.

In Table 2, the process steps are constituted by the protection film forming step and the etching step. However, the process steps are not limited to these and may be constituted by two etching steps. Furthermore, cycle etching constituted by three or more process steps is often employed. An experiment or the like on the gas used in the transition step should be performed in advance to confirm that the processed substrate is not etched. Furthermore, a type of gas used in the transition step is not limited to one type, and two or more types of gases may be used. Still further, the transition step of the example has been described with an example using the Ar gas. However, inert gases such as He, Xe, Kr, N₂ and the like may be used for the present invention.

Moreover, when the RF bias power is 0 W in the transition step, the etching can be suppressed to the minimum. However, when the RF bias power is applied in the transition step as shown in FIG. 4, time-modulated intermittent RF bias power may be applied in addition to continuous RF bias power. This reduces the collision time of the ions to the processed substrate so that it becomes difficult to etch. Moreover, in addition to the RF bias power, the radio-frequency power for generating the plasma can also be time-modulated and intermittently applied. This reduces the numbers of radicals and ions in the plasma, making it more difficult to etch the processed substrate.

As described above, the present invention switches to the radio-frequency bias power and other parameters of the subsequent step after detecting that there is no remaining gas introduced in the previous step and detecting that the process chamber is filled with the gas of the subsequent step in the cycle etching in which the transition step, which continues the plasma discharge by introducing a gas capable of continuing plasma discharge without etching the processed substrate, the sample, in the vacuum process chamber, is provided between a plurality of process steps, each having a different gas and process condition, and each process step. This enables precise synchronization between the process gas in the process chamber and the radio-frequency bias power without mixing the gases of the plurality of process steps in the plasma processing method performed while replacing the gas. Therefore, it is possible to perform stable plasma etching process with high profile control.

The above examples have been described with an example of the etching device utilizing the micro wave ECR discharge. However, the same effects as those in the examples can be obtained by a plasma etching device utilizing other discharges such as effective magnetic field UHF discharge, capacitively-coupled discharge, inductively-coupled discharge, magnetron discharge, surface wave excited discharge or transfer-coupled discharge. Furthermore, the etching device has been described in the examples. However, the same effects as those in the examples can be obtained by other plasma processing devices, which perform plasma processing, for example, a plasma chemical vapor deposition (CVD) device or a plasma physical vapor deposition (PVD) device.

What is claimed is:

1. A plasma processing method which performs plasma processing on a sample in a process chamber by a plurality steps constituting plasma processing conditions, comprising:
   a first step of performing one step;
   a second step of stopping supply of gas in the one step while supplying an inert gas after the first step;
   a third step of stopping the supply of the inert gas in the second step while supplying a gas in another step after the second step; and
   a fourth step of performing the other step,
   wherein an amount of the gas in the one step remaining inside the process chamber is detected in the second step,
   an amount of the gas in the other step reached inside the process chamber is detected in the third step,
   the second step is transitioned to the third step based on a detection result of the second step, and the third step is transitioned to the fourth step based on a detection result of the third step.

2. The plasma processing method according to claim 1, the amount of the gas in the one step remaining inside the process chamber is detected based on a change in plasma emission in the second step, and the amount of the gas in the other step reached inside the process chamber is detected based on a change in plasma emission in the third step.

3. The plasma processing method according to claim 1, wherein in the second step and the third step, a radio-frequency power is supplied to a sample stage, on which a sample is placed, the amount of the gas in the one step remaining inside the process chamber is detected based on a change in a peak-to-peak voltage of the radio-frequency power in the second step, and the amount of the gas in the other step reached inside the process chamber is detected based on a change in an inter-peak voltage of the radio-frequency power in the third step.

4. The plasma processing method according to claim 1, wherein the radio-frequency power is supplied to a sample stage, on which the sample is placed, after detecting that the gas in the other step has reached inside the process chamber.

5. The plasma processing method according to claim 1, wherein in the second step and the third step, a time-modulated radio-frequency power is supplied to a sample stage, on which the sample is placed.

6. The plasma processing method according to claim 5, wherein in the second step and the third step, plasma is generated by the time-modulated radio-frequency power.

\* \* \* \* \*